(12) United States Patent
Kumata

(10) Patent No.: US 7,511,544 B2
(45) Date of Patent: Mar. 31, 2009

(54) DIGITAL DLL CIRCUIT FOR AN INTERFACE CIRCUIT IN A SEMICONDUCTOR MEMORY

(75) Inventor: Ichiro Kumata, Kanagawa (JP)

(73) Assignee: Sony Corporation (JP)

( * ) Notice: Subject to any disclaimer, the term of this patent is extended or adjusted under 35 U.S.C. 154(b) by 40 days.

(21) Appl. No.: 11/707,953

(22) Filed: Feb. 20, 2007

(65) Prior Publication Data

US 2007/0194823 A1     Aug. 23, 2007

(30) Foreign Application Priority Data

Feb. 21, 2006   (JP)   ............................. 2006-043963

(51) Int. Cl.
*H03L 7/06*  (2006.01)

(52) U.S. Cl. .................. 327/158; 327/159; 327/160; 327/161

(58) Field of Classification Search .............. 327/158, 327/161
See application file for complete search history.

(56) References Cited

U.S. PATENT DOCUMENTS 6,087,868 A * 7/2000 Millar ........................ 327/156

FOREIGN PATENT DOCUMENTS

JP   2004-531981   10/2004
JP   2005-142859   6/2005

* cited by examiner

*Primary Examiner*—Kenneth B Wells
*Assistant Examiner*—John W Poos
(74) *Attorney, Agent, or Firm*—Rader Fishman & Grauer PLLC; Ronald P. Kananen

(57) ABSTRACT

A digital DLL circuit includes: a first register configured to hold a delay specifying value to specify a delay; a second register configured to specify a correction value for a gate delay inside an LSI; a digitally-controlled variable delay circuit; and a control circuit configured to produce a delay control value to implement control so that a delay by the variable delay circuit is kept at the delay specifying value of the first register. The digital DLL circuit further includes an adder circuit configured to add a gate delay correction value held by the second register to the delay control value output from the control circuit, and output a resultant value to a control input of the variable delay circuit.

2 Claims, 7 Drawing Sheets

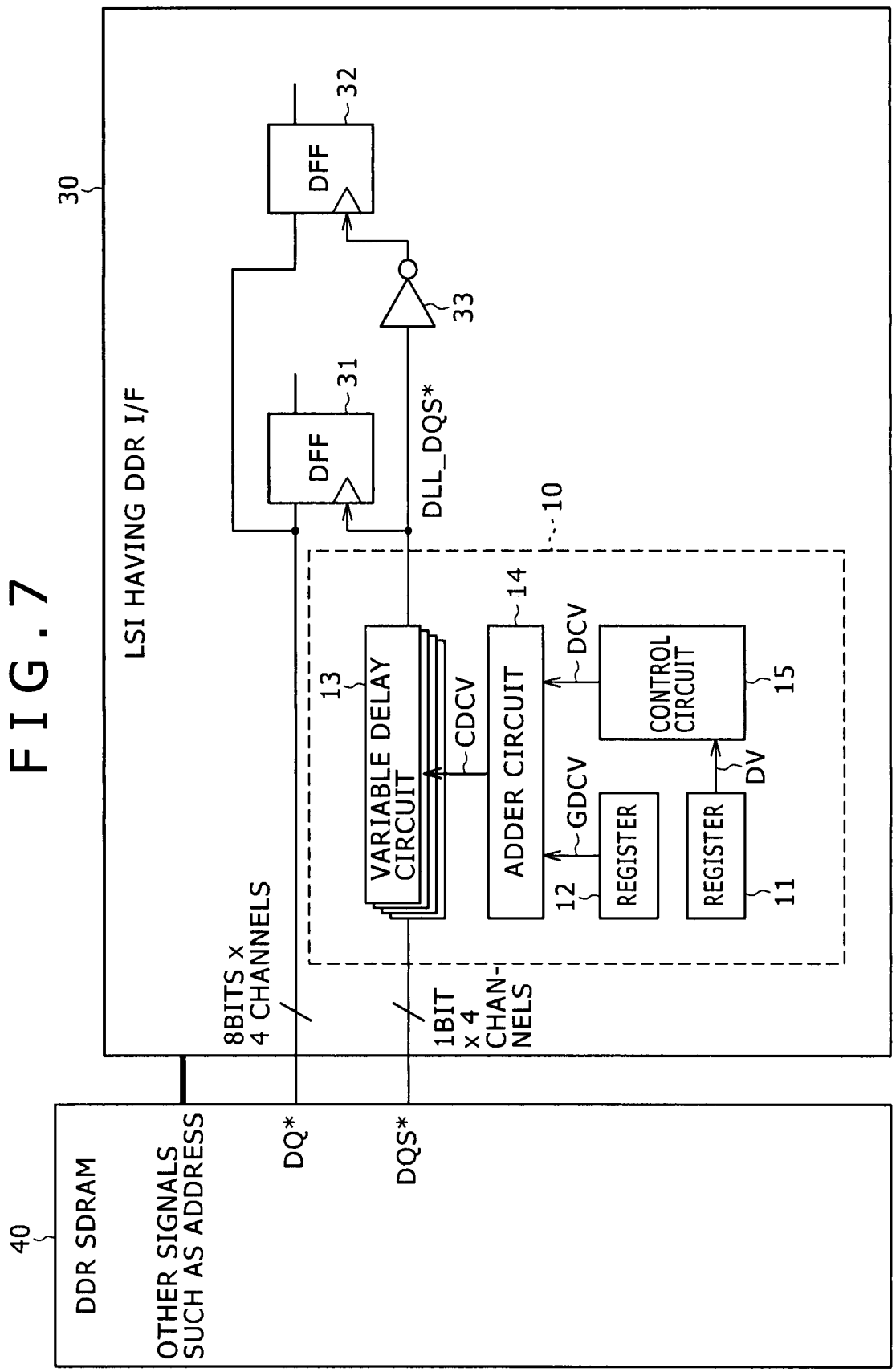

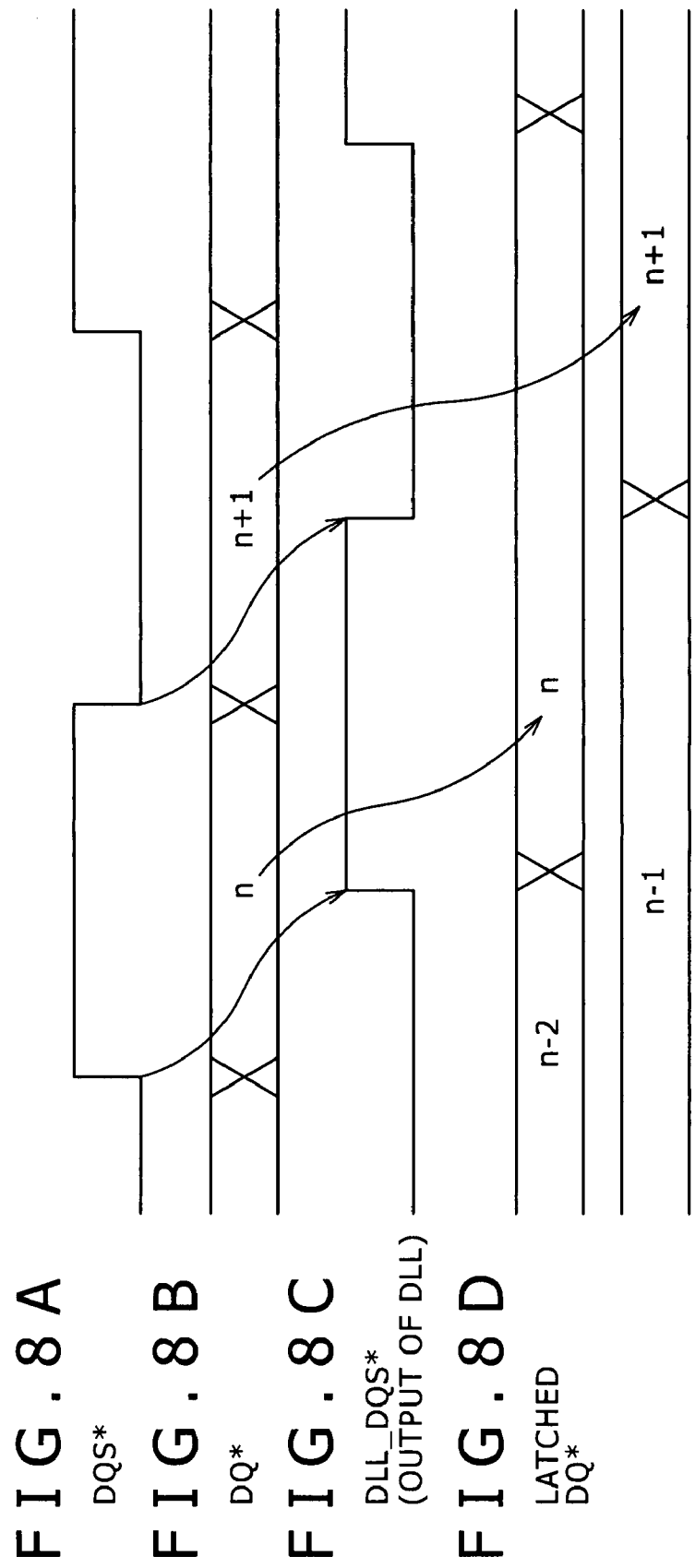

DIGITAL DLL CIRCUIT FOR AN INTERFACE CIRCUIT IN A SEMICONDUCTOR MEMORY

CROSS REFERENCES TO RELATED APPLICATIONS

The present invention contains subject matter related to Japanese Patent Application JP 2006-043963 filed with the Japanese Patent Office on Feb. 21, 2006, the entire contents of which are incorporated herein by reference.

BACKGROUND OF THE INVENTION

1. Field of the Invention

The present invention relates to a digital delay locked loop (DLL) circuit that is applicable to an interface circuit for a memory, such as a DRAM.

2. Description of the Related Art

The circuit delay inside an LSI fluctuates depending on the supply voltage, temperature, and variation in the process at the time of the fabrication.

The DLL circuit is used to suppress the fluctuation to thereby realize a desired stable delay.

The DLL is a technique to regulate based on its circuit configuration the amount of the delay (time difference) arising between a clock signal from the external of the chip and a clock signal inside the chip, and thereby can realize a short clock access time and a high operating frequency. The DLL circuit is used for, e.g., an interface circuit for a DRAM.

Various circuits have been proposed as this kind of DLL circuit; refer to, e.g., Japanese Patent Laid-open No. 2005-142859 (FIGS. 1 and 8) and JP-A-2004-531981 (FIGS. 1 and 3). Hereinafter referred to as Patent Document 1 and Patent Document 2, respectively.

In the DLL circuits disclosed in Patent Document 1 and Patent Document 2, feedback control for a variable delay circuit is carried out so that the variable delay circuit typically keeps a delay value that is predefined or specified by a register.

SUMMARY OF THE INVENTION

As described above, in existing DLL circuits, feedback control for a variable delay circuit is carried out so that the variable delay circuit typically keeps a delay value that is predefined or specified by a register.

An example in which such a DLL circuit is used to adjust the timing of sampling of data is shown in FIG. 1.

In this diagram, an existing DLL circuit 3 is provided on the clock side of a D-type flip-flop (D-FF) 2 in order to optimize a sampling timing of data input to an LSI 1 from the external. On the data input side, inverters INV1 and INV2 as buffers for driving an interconnect are connected in series to each other. On the clock input side, inverters INV3 to INV6 as buffers for driving an interconnect are connected in series to each other.

The delay by the DLL circuit 3 is selected so that optimal sampling timing is achieved. In an actual LSI 1, it is difficult to connect the external inputs directly to the DLL circuit 3 and the D-FF 2, and hence, in most cases, buffers are necessary at the front stages of the DLL circuit 3 and the D-FF 2, like in FIG. 1.

This configuration of FIG. 1 involves no problem if the buffer delay on the data side and that on the clock side are identical to each other. However, it takes a long time to design a circuit in which the difference in the buffer delay is very small. Even if the delay difference is eliminated in the design, a difference actually arises due to variation in the fabrication and so on. Such a delay difference varies depending on the supply voltage and temperature of the LSI 1 and variation in the process at the time of the fabrication thereof.

If the correction of such a delay difference by an existing method is intended, interconnects and gates of the LSI 1 need to be modified, or a delay adjustment circuit needs to be incorporated in the LSI 1 in advance separately from the DLL circuit 3.

In the former scheme, the LSI manufacturing mask needs to be modified to remanufacture the LSI in order to adjust the delay.

In the latter scheme, if the accuracy of the delay adjustment circuit is high or the adjustment width thereof is wide, the circuit scale becomes larger.

There is a need for the present invention to provide a digital DLL circuit that can easily cancel an external gate delay error even in the presence of variations in the supply voltage, temperature and process, and thus can eliminate the need to remanufacture the LSI after the delay error has been proven to exist or add a delay adjustment mechanism separately from the DLL.

According to one embodiment of the present invention, there is provided a digital DLL circuit that includes a first register configured to hold a delay specifying value to specify a delay, a second register configured to specify a correction value for a gate delay inside an LSI, and a digitally-controlled variable delay circuit. The digital DLL circuit further includes a control circuit configured to produce a delay control value to implement control so that the delay by the variable delay circuit is kept at the delay specifying value of the first register and an adder circuit configured to add a gate delay correction value held by the second register to the delay control value output from the control circuit and output the resultant value to the control input of the variable delay circuit.

According to embodiments of the present invention, an external gate delay error can be cancelled even in the presence of variations in the supply voltage, temperature and process, which can eliminate the need to remanufacture the LSI after the delay error has been proven to exist or add a delay adjustment mechanism separately from a DLL.

BRIEF DESCRIPTION OF THE DRAWINGS

FIG. 7 is a diagram for explaining a DDR interface; and

FIGS. 8A to 8D are a timing chart for explaining the operation of a DLL that functions as a DDR interface.

DETAILED DESCRIPTION OF THE PREFERRED EMBODIMENTS

An embodiment of the present invention will be described below in association with the accompanying drawings.

Figure 1:
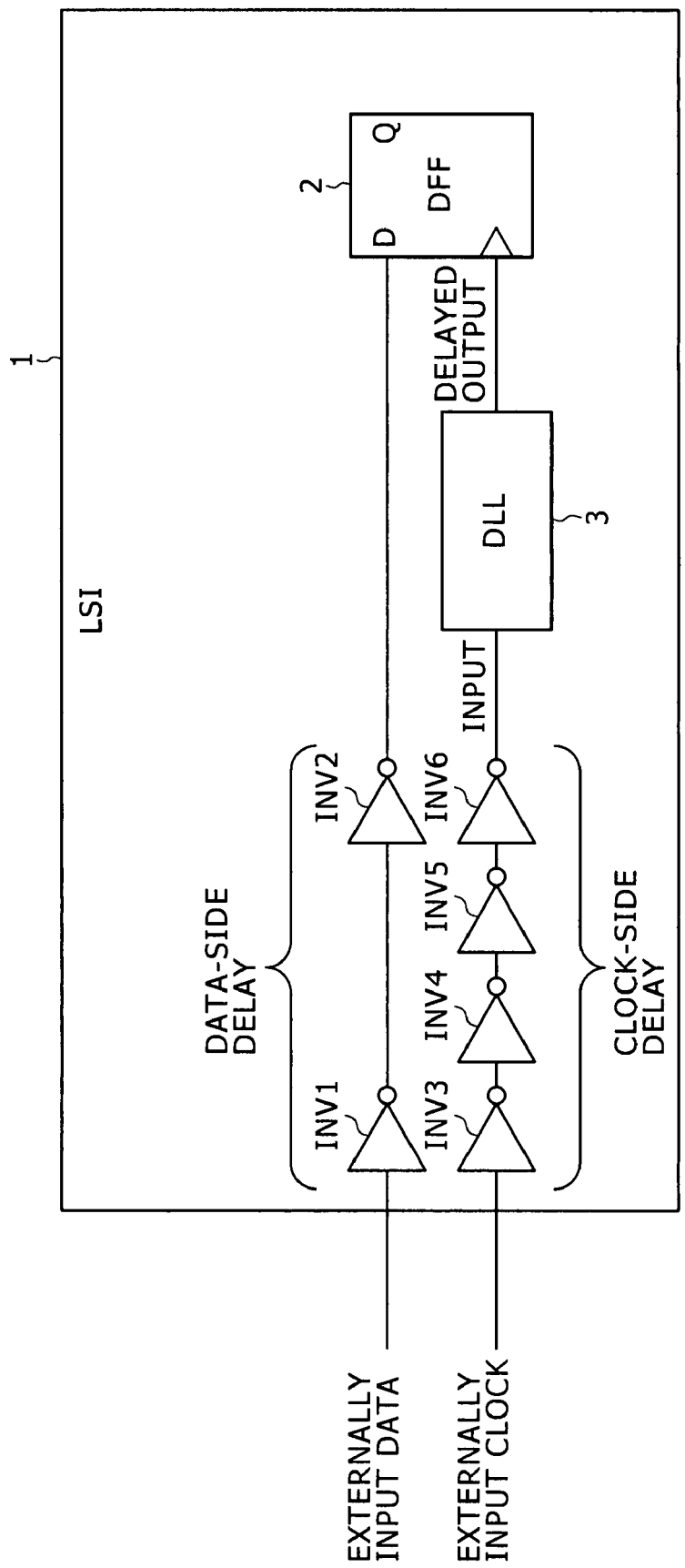
FIG. 1 is a diagram showing an example in which a typical DLL is mounted in an LSI.
Figure 2:
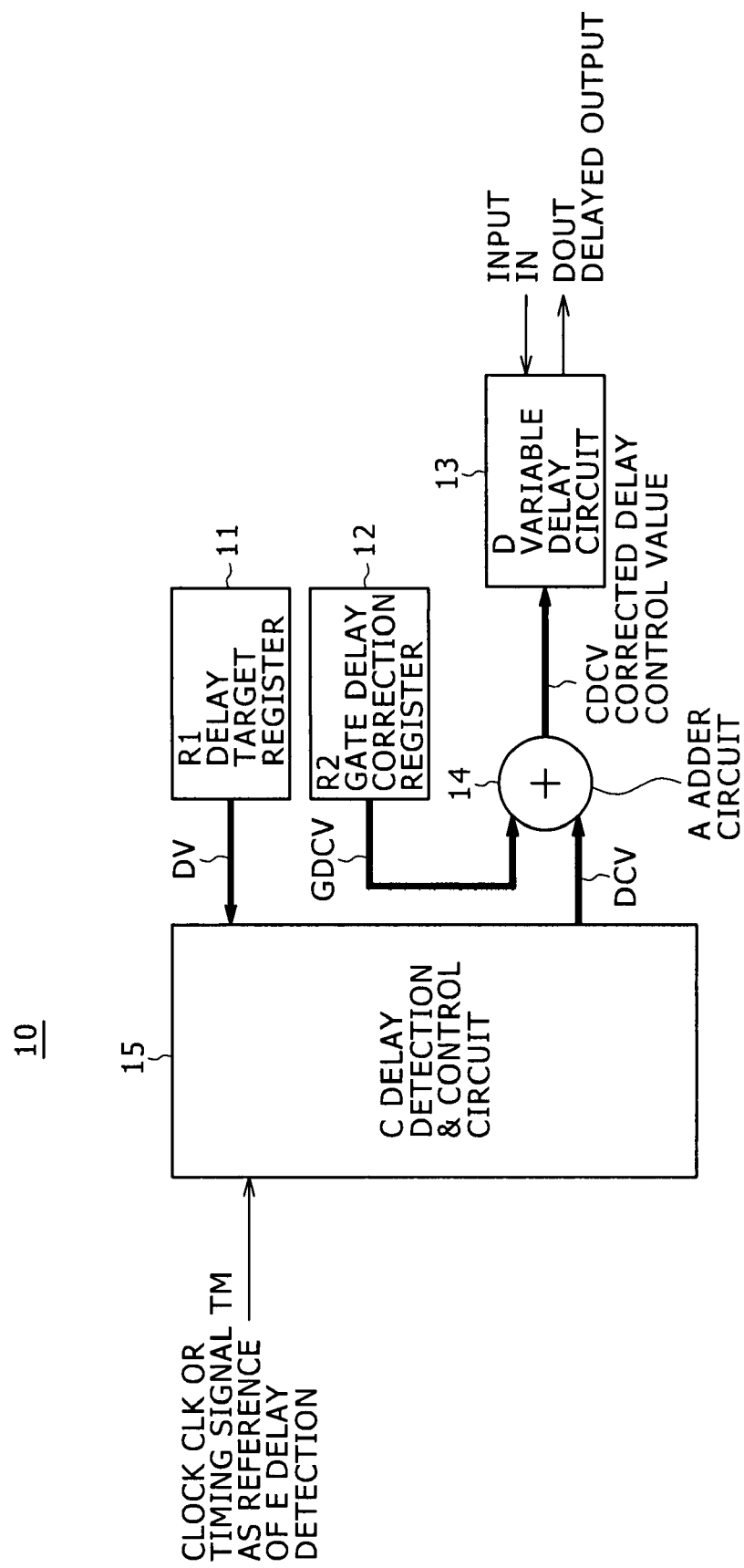
FIG. 2 is a block diagram showing a digital DLL circuit according to an embodiment of the present invention.

FIG. 2 is a block diagram showing a digital DLL circuit according to an embodiment of the present invention.

The digital DLL circuit of the present embodiment can easily cancel an external gate delay error even in the presence of variations in the supply voltage, temperature and process, and thus it can eliminate the need to remanufacture the LSI after the delay error has been proven to exist or add a delay adjustment mechanism separately from the DLL.

Referring to FIG. 2, a digital DLL circuit 10 includes a first register 11, a second register 12, a variable delay circuit 13, an adder circuit 14, and a control circuit 15.

The first register 11 holds a predefined delay specifying value DV.

The second register 12 holds a gate delay correction value GDCV which specifies a correction value for the gate delay inside the LSI.

The digitally-controlled variable delay circuit 13 delays input data IN by a corrected delay control value (amount) CDCV to thereby obtain a delayed output DOUT. The corrected delay control value CDCV arises from addition, in the adder circuit 14, of the gate delay correction value GDCV to a delay control value DCV supplied from the control circuit 15.

Figure 3:
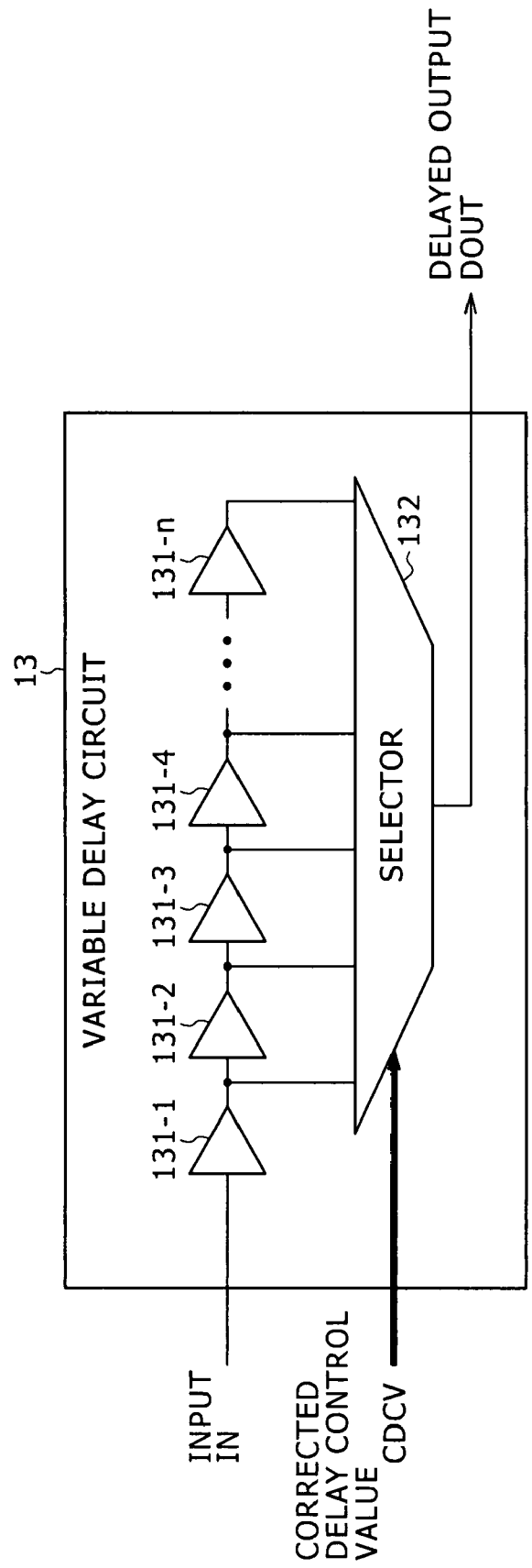
FIG. 3 is a diagram conceptually showing a configuration example of a digitally-controlled variable delay circuit according to the embodiment.

FIG. 3 is a diagram conceptually showing a configuration example of the digitally-controlled variable delay circuit 13.

The variable delay circuit 13 in FIG. 3 includes plural delay elements 131-1 to 131-$n$ that are cascaded and connected to the input IN and a selector 132 that selects the output of either one of the delay elements 131-1 to 131-$n$ depending on the corrected delay control value CDCV supplied from the adder circuit 14 to thereby obtain the delayed output DOUT.

The adder circuit 14 adds the gate delay correction value GDCV held by the second register 12 to the delay control value DCV output from the control circuit 15, and outputs the resultant value to the control input of the variable delay circuit 13.

The control circuit 15 produces the delay control value DCV to implement control so that the delay by the variable delay circuit 13 is kept at the delay specifying value DV of the first register 11, and outputs the delay control value DCV to the adder circuit 14.

Specifically, the control circuit 15 subjects a reference signal and the delay specifying value of the first register to digital arithmetic operation, and outputs to the adder circuit the operation result as the delay control value.

The control circuit 15 detects a change of the gate delay due to variations in the supply voltage, temperature and process at the time of the fabrication of the LSI in which the above-described circuits are mounted basically, and implements feedback to the variable delay circuit 13.

To calculate the feedback control value inside the control circuit 15, an externally input reference clock CLK or reference timing signal TM is compared with the output of a ring oscillator or measurement-target delay circuit that is provided in the control circuit 15 to detect a delay change dependent upon the temperature, supply voltage and process variations of the chip.

As another configuration, instead of including a ring oscillator or measurement-target delay circuit, the control circuit may compare a reference clock with input/output signals of the DLL and the delay difference of the signals.

Due to the control by the control circuit 15, the delay between the input and output of the variable delay circuit 13 is kept near the delay target value specified by the first register 11.

The basic function of the control circuit 15 has been described above. In the present embodiment, the second register 12 and the adder circuit 14 are further included, as described above.

Specifically, the adder circuit 14 adds the gate delay correction value GDCV specified by the second register 12 to the delay control value DCV produced by the control circuit 15.

As the value held by the second register 12, a negative value is also available in addition to a positive value.

However, the value of the addition result by the adder circuit 14 is limited within the range acceptable for the variable delay circuit 13.

The following description is based on an assumption that the delay by the variable delay circuit 13 increases and decreases linearly in association with a change of the corrected delay control value CDCV input to the variable delay circuit 13.

Even when the delay by the variable delay circuit 13 involves some degree of nonlinearity and a polarity difference, the present system can be applied.

Figure 4:
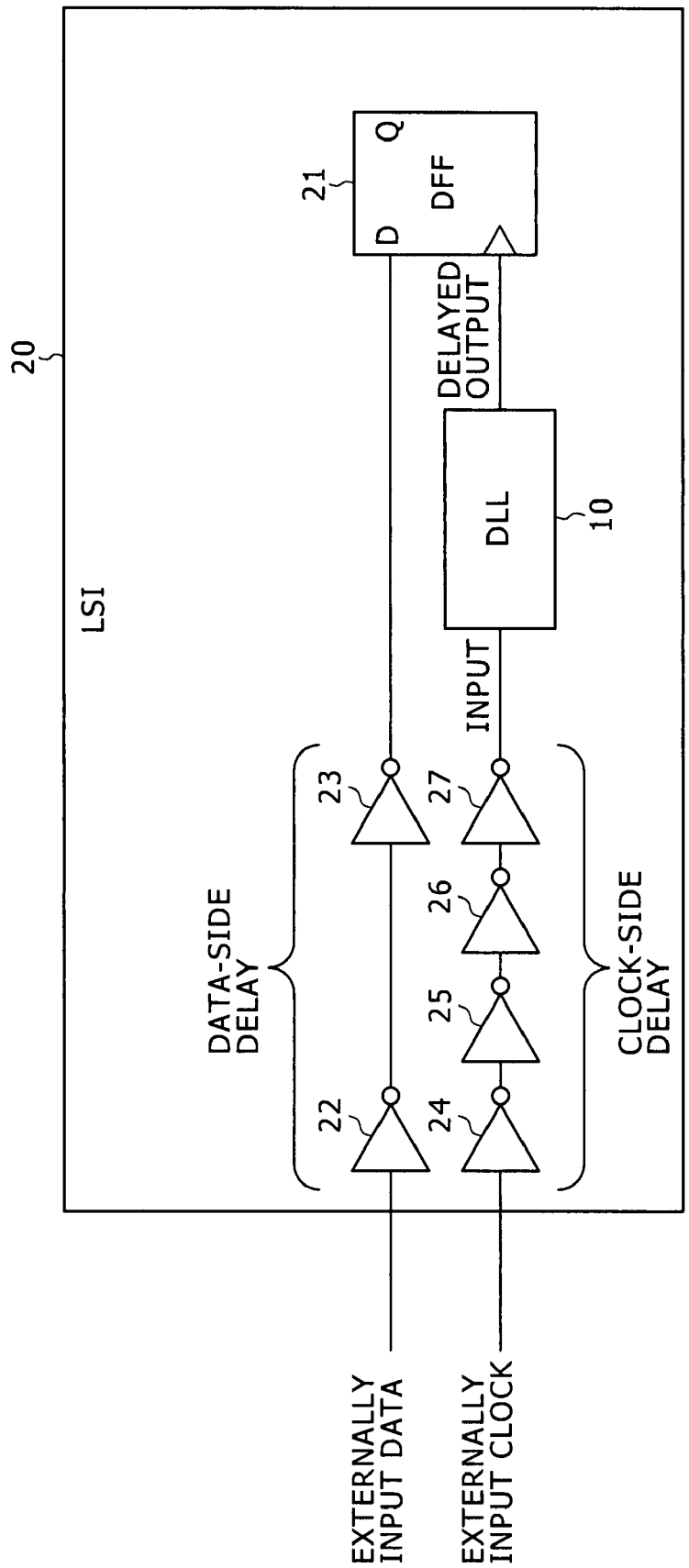
FIG. 4 is a diagram showing an application example of the digital DLL circuit according to the embodiment.

FIG. 4 is a diagram showing an application example of the digital DLL circuit according to the present embodiment.

Referring to FIG. 4, numeral 20 denotes an LSI in which the digital DLL circuit 10 of the embodiment is mounted. In the LSI 20, a D-type flip-flop 21 is disposed.

On the D-input side of the D-type flip-flop 21, inverters 22 and 23, as data delay buffers, are disposed and connected in series. On the clock-input side, the digital DLL circuit 10 is disposed.

Furthermore, on the input side of the digital DLL circuit 10, inverters 24 to 27, as clock delay buffers, are disposed with a cascade connection.

In the configuration of FIG. 4, if there is a relative difference between the data-side delay and the clock-side delay, a correction value is set in the second register 12 of FIG. 2 so that the delay difference is cancelled.

Thus, a DLL delay is added or reduced by this correction value to or from the fixed delay target value that should be satisfied by the DLL originally. This can cancel the relative difference between the data-side delay and the clock-side delay that vary depending on the supply voltage and so on.

Figure 5:
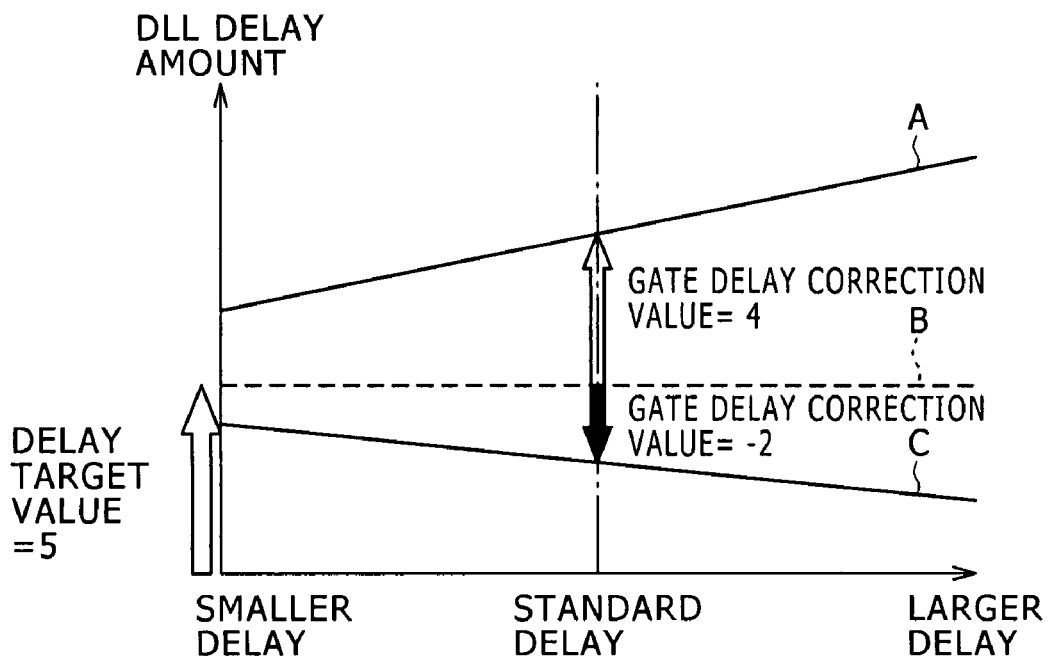
FIG. 5 is a diagram showing the relationship between a DLL delay and a LSI gate delay in the embodiment.

FIG. 5 is a diagram showing the relationship between the DLL delay and LSI gate delay in the present embodiment.

In FIG. 5, the operation point corresponding to a fixed delay target value of 5 is indicated by the dashed line B as an example.

A variation in the gate delay dependent upon the supply voltage and so on inside the LSI 20 is indicated on the abscissa. Even in the presence of this variation, the delay by the DLL is kept constant due to feedback as indicated by the dashed line B.

Figure 6:
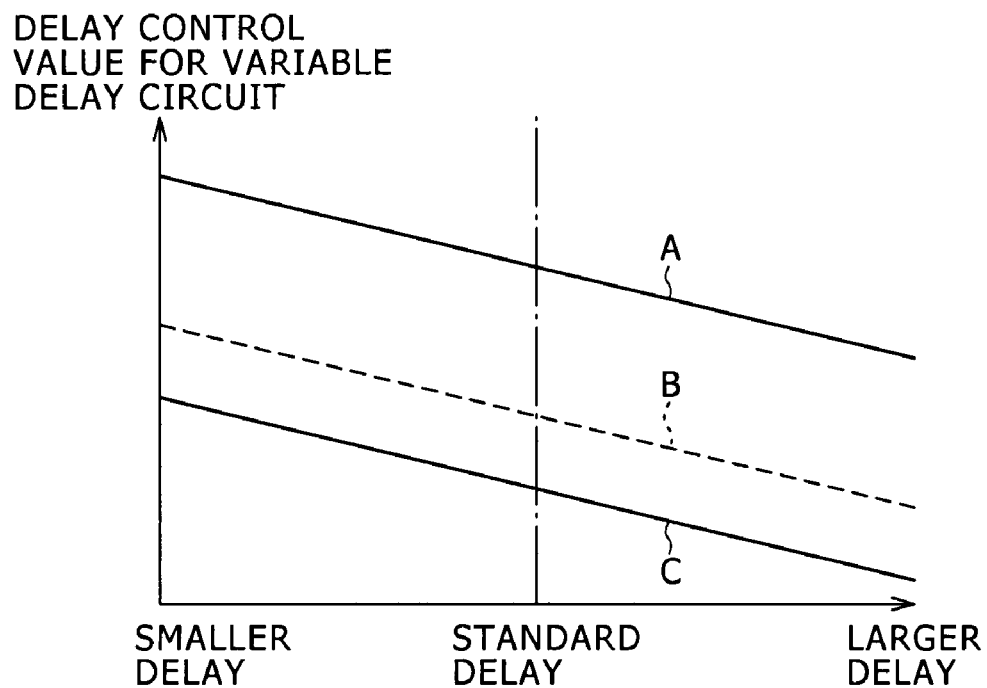
FIG. 6 is a diagram showing the relationship between a delay control value in the DLL and the gate delay in the LSI in the embodiment.

FIG. 6 is a diagram showing the relationship between the delay control value in the DLL and the gate delay in the LSI in the present embodiment.

In order to realize the constant DLL delay indicated by the dashed line B in FIG. 5, feedback control is implemented so that the control value for the variable delay circuit 13 inside the DLL is in inverse proportion to the gate delay inside the LSI 20, as indicated by the dashed line B in FIG. 6. This feedback control corresponds to the original DLL operation.

To describe an additional operation to the original DLL operation, the operation states when the gate delay correction register value in the circuit of the embodiment is +4 and −2, as indicated by the full lines A and C, respectively, in FIGS. 5 and 6 as an example.

Addition of the gate delay correction value to the delay control value for the variable delay circuit 13 results in the control value for the variable delay circuit 13 indicated by the full line A or C in FIG. 6. As a result, the DLL delay like that indicated by the full line A or C in FIG. 5 is obtained.

When in the circuit of FIG. 4, the gate delay outside the DLL involves an error from a desired delay by the magnitude, of e.g., −4 or +2, the value with the inverse polarity such as +4 or −2, is set as the gate delay correction register value of the second register 12 in this circuit, as described above. This can typically correct the error in the gate delay that changes due to a variation in the supply voltage and so on.

The correction of a gate delay difference will be described below from another viewpoint.

The following description is based on the digitally-controlled variable delay circuit shown in FIG. 2 as an example.

For a basic delay, the delays of logic gates having almost the same characteristics as those of gates other than the DLL inside the LSI are employed, and a desired delay is selected from the plural delays.

The gate delay in the variable delay circuit 13 is affected by variations in the supply voltage, temperature and fabrication of the LSI, similarly to the gates outside the DLL. In an existing DLL, a proper delay point is selected through feedback control to thereby obtain a desired fixed delay.

In the present embodiment, the following operation is implemented in addition to the selection of the delay point through feedback control. Specifically, an offset value equivalent to a correction-target delay is added or subtracted to or from the point selected through feedback control, so that the selected point is shifted by a specified number of gates.

The delay by the gates in the specified number, independent of the feedback, changes depending on the variations in the supply voltage, temperature and fabrication, similarly to the gate delay outside the DLL. Therefore, the external gate delay difference can be cancelled under any condition.

As described above, according to the present embodiment, the digital DLL circuit 10 includes the first register 11 that holds a delay specifying value to specify a delay, the second register 12 for specifying a correction value for the gate delay inside the LSI, and the digitally-controlled variable delay circuit 13. The digital DLL circuit 10 further includes the control circuit 15 that produces the delay control value DCV to implement control so that the delay by the variable delay circuit 13 is kept at the delay specifying value of the first register 11 and the adder circuit 14 that adds the gate delay correction value GDCV held by the second register 12 to the delay control value DCV output from the control circuit and outputs the resultant value to the control input of the variable delay circuit 13. Therefore, the digital DLL circuit 10 has an advantage of being allowed to easily cancel an external gate delay error even in the presence of variations in the supply voltage, temperature and process, and thus it can eliminate the need to remanufacture the LSI after the delay error has been proven to exist or add a delay adjustment mechanism separately from the DLL.

The digital DLL circuit 10 having the above-described features can be used as an interface circuit for a double data rate (DDR) DRAM, like the one shown in FIG. 7, for example.

In FIG. 7, reference numeral 40 denotes a DDR synchronous DRAM (SDRAM), and numeral 30 denotes a certain LSI. Furthermore, numerals 31 and 32 denote D-type flip-flops, and numeral 33 denotes an inverter.

In FIG. 7, an illustration of a power supply system is omitted.

FIGS. 8A to 8D are a timing chart for explaining the operation of the DLL circuit that functions as a DDR interface.

When data are read out from the DDR SDRAM 40, a signal DQS* that indicates the timings of changes of read data DQ* is output for each certain group (e.g., for each 8 bits) of the read data DQ*.

To latch the read data inside the LSI 30, it is necessary that the signal DQS* be delayed by the period about one-fourth the clock cycle so as to be used as a load clock.

The digital DLL circuit 10 produces a stable delayed signal DQS for the latch.

In this manner, the digital DLL circuit can be applied as a DDR interface, and it can produce a stable clock signal of which the delay oscillation is small.

It should be understood by those skilled in the art that various modifications, combinations, sub-combinations and alterations may occur depending on design requirements and other factors insofar as they are within the scope of the appended claims or the equivalents thereof.

What is claimed is:

1. A digital DLL circuit comprising:
   a first register configured to hold a delay specifying value to specify a delay;
   a second register configured to specify a correction value for a gate delay inside an LSI;
   a digitally-controlled variable delay circuit;
   a control circuit configured to produce a delay control value to implement control so that a delay by the variable delay circuit is kept at the delay specifying value of the first register; and
   an adder circuit configured to add a gate delay correction value held by the second register to the delay control value output from the control circuit, and output a resultant value to a control input of the variable delay circuit.

2. The digital DLL circuit according to claim 1, wherein the control circuit subjects a reference signal and the delay specifying value of the first register to a digital arithmetic operation, and outputs to the adder circuit a result of the arithmetic operation as the delay control value.

* * * * *